United States Patent
Kimura (10) Patent No.: US 8,446,192 B2
(45) Date of Patent: May 21, 2013

(54) PLL CIRCUIT

(75) Inventor: Hiroki Kimura, Chitose (JP)

(73) Assignee: Nihon Dempa Kogyo Co., Ltd, Tokyo (JP)

(*) Notice: Subject to any disclaimer, the term of this patent is extended or adjusted under 35 U.S.C. 154(b) by 483 days.

(21) Appl. No.: 12/801,498

(22) Filed: Jun. 11, 2010

(65) Prior Publication Data

US 2010/0315137 A1    Dec. 16, 2010

(30) Foreign Application Priority Data

Jun. 12, 2009  (JP) ............... P.2009-141116
Mar. 31, 2010  (JP) ............... P.2010-081506

(51) Int. Cl.
*H03L 7/06*    (2006.01)

(52) U.S. Cl.
USPC .......................................... 327/156

(58) Field of Classification Search
None
See application file for complete search history.

(56) References Cited

U.S. PATENT DOCUMENTS

2009/0091396 A1* 4/2009 Jian et al. ............. 331/16

FOREIGN PATENT DOCUMENTS

| JP | 63-035017 | 2/1988 |
|---|---|---|
| JP | H07-131343 | 5/1995 |
| JP | 09-018336 | 1/1997 |
| JP | H09-008551 | 1/1997 |
| JP | H10-022825 | 1/1998 |
| JP | 2003-069426 | 3/2003 |
| JP | 2004-166179 | 6/2004 |
| JP | 2007-208367 | 8/2007 |
| JP | 2008-193389 | 8/2008 |

* cited by examiner

*Primary Examiner* — Daniel Rojas
(74) *Attorney, Agent, or Firm* — Jacobson Holman PLLC (57) ABSTRACT

A PLL circuit which can obtain a VCO output having satisfactory spurious output characteristics with respect to all channels and which can suppress the fluctuation of the characteristics due to a temperature change is disclosed. A control circuit 3 provides a frequency division ratio table 32 where frequency division ratios to improve spurious output characteristics in the output of a VCO for each channel number at temperatures are stored, and the control circuit reads, from the table 32, the frequency division ratio corresponding to the temperature detected by the temperature sensor 31 and an input channel number, to set the frequency division ratio in a PLL IC 2 and to set the channel number and the frequency division ratio in a DDS circuit 4. The DDS circuit 4 calculates the value of a reference frequency based on the channel number and the frequency division ratio to generate the reference frequency.

7 Claims, 7 Drawing Sheets

| ch | div | | |
|---|---|---|---|
| | LOW TEMPERERATURE | ORDINARY TEMPERATURE | HIGH TEMPERATURE |
| 1 | 133 | 135 | 135 |
| 2 | 133 | 135 | 135 |
| 3 | 135 | 137 | 137 |
| 4 | 135 | 137 | 137 |
| 5 | 133 | 133 | 133 |
| 6 | 133 | 133 | 133 |
| 7 | 133 | 133 | 133 |
| 8 | 137 | 137 | 133 |
| 9 | 137 | 137 | 133 |
| 10 | 135 | 137 | 133 |
| 11 | 133 | 133 | 135 |
| 12 | 133 | 133 | 135 |
| 13 | 133 | 135 | 135 |
| 14 | 137 | 135 | 135 |
| 15 | 133 | 137 | 135 |
| 16 | 133 | 137 | 133 |
| 17 | 137 | 137 | 133 |
| 18 | 137 | 137 | 133 |
| 19 | 133 | 137 | 133 |
| 20 | 133 | 137 | 133 |
| 21 | 133 | 133 | 133 |
| 22 | 137 | 133 | 133 |
| 23 | 137 | 133 | 133 |
| 24 | 133 | 137 | 133 |
| 25 | 133 | 133 | 135 |
| 26 | 133 | 133 | 137 |
| 27 | 133 | 137 | 133 |
| 28 | 133 | 137 | 133 |
| 29 | 137 | 133 | 133 |
| 30 | 137 | 133 | 135 |

| ch | VCO OUTPUT FREQUENCY (GHz) | FREQUENCY DIVISION RATIO | DDS OUTPUT FREQUENCY (MHz) |
|---|---|---|---|
| 0 | 2000 | 133 | 15.03759 |
| 0 | 2000 | 137 | 14.59854 |
| 600 | 2060 | 133 | 15.48872 |
| 600 | 2060 | 137 | 15.03649 |

PLL CIRCUIT

This application has a priority of Japanese no. 2009-141116 filed Jun. 12, 2009 and Japanese no. 2010-081506 filed Mar. 31, 2010, hereby incorporated by reference.

BACKGROUND OF THE INVENTION

1. Field of the Invention

The present invention relates to a PLL circuit. More particularly, it relates to a PLL circuit which can improve spurious output characteristics.

2. Description of the Related Art

Figure 7:
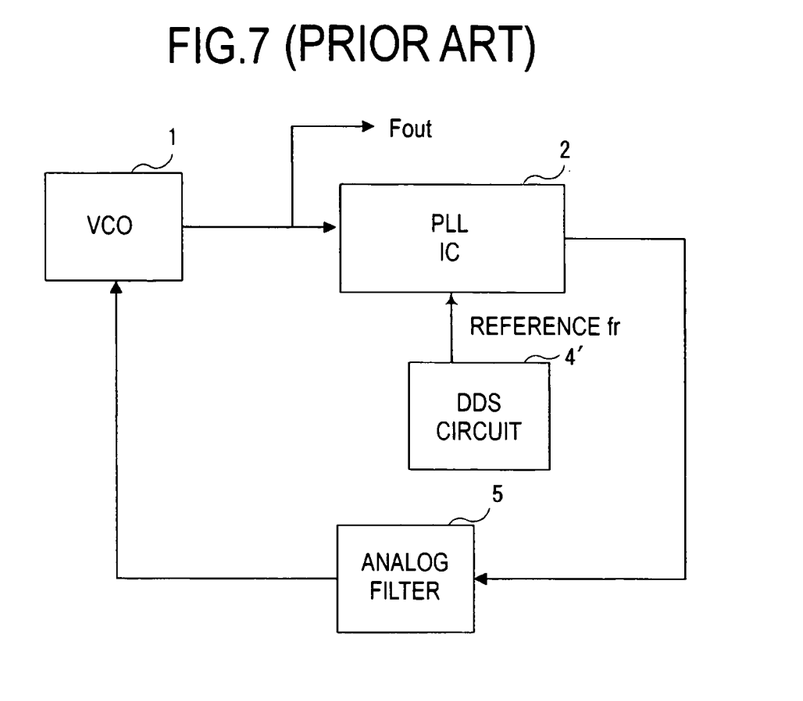
FIG. 7 is a constitution block diagram showing a constitution of a typical PLL circuit.

[Description of Prior Art: FIG. 7]

A typical phase locked loop (PLL) circuit will be described with reference to FIG. 7. FIG. 7 is a constitution block diagram showing a constitution of the typical PLL circuit.

As shown in FIG. 7, the typical PLL circuit is constituted of a voltage-controlled oscillator (VCO) 1, a PLL IC 2, a direct digital synthesizer (DDS) circuit 4' and an analog filter 5.

The VCO 1 oscillates a frequency in accordance with a control voltage from the analog filter 5.

The PLL IC 2 is an integrated circuit which divides the output frequency of the VCO 1 at a set frequency division ratio and which compares the frequency with a reference frequency from the DDS circuit 4', thereby outputting a voltage to control the output frequency of the VCO 1 so that the frequency becomes a regulated frequency, and the circuit is made of one chip.

The DDS circuit 4' generates and outputs a reference frequency signal based on a set channel number.

The analog filter 5 extracts a direct-current component from the voltage from the PLL IC 2 to output the control voltage of the VCO 1.

In the PLL circuit having the above constitution, the PLL IC 2 divides the output signal of the VCO 1 input into the PLL IC at a designated frequency division ratio, compares the phase of the signal with that of the reference frequency signal from the DDS circuit 4' to output the voltage based on a phase difference, and the direct-current component is extracted through the analog filter 5 to obtain and apply the control voltage to the VCO 1. In consequence, an output Fout of the VCO 1 has a regulated frequency.

Figure 8:
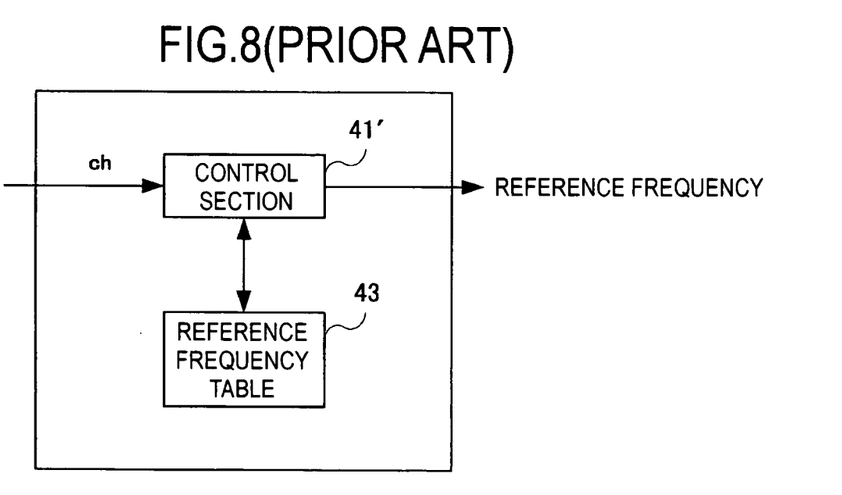
FIG. 8 is a schematic constitution diagram of a conventional DDS circuit 4'.

[DDS Circuit 4': FIG. 8]

Here, a schematic constitution of the DDS circuit 4' in the conventional PLL circuit will be described with reference to FIG. 8. FIG. 8 is a schematic constitution diagram of the conventional DDS circuit 4'.

As shown in FIG. 8, the basic constitution of the conventional DDS circuit 4' comprises a control section 41' and a reference frequency table 43.

In the reference frequency table 43, the reference frequencies corresponding to the channel numbers are stored.

Moreover, upon input of the channel number, the control section 41' reads the reference frequency with reference to the reference frequency table 43 to output corresponding sine wave data.

Furthermore, a D/A converter (not shown) converts a signal into an analog signal, and the signal is output as a reference frequency signal to the PLL IC 2 through a filter.

Figure 9:
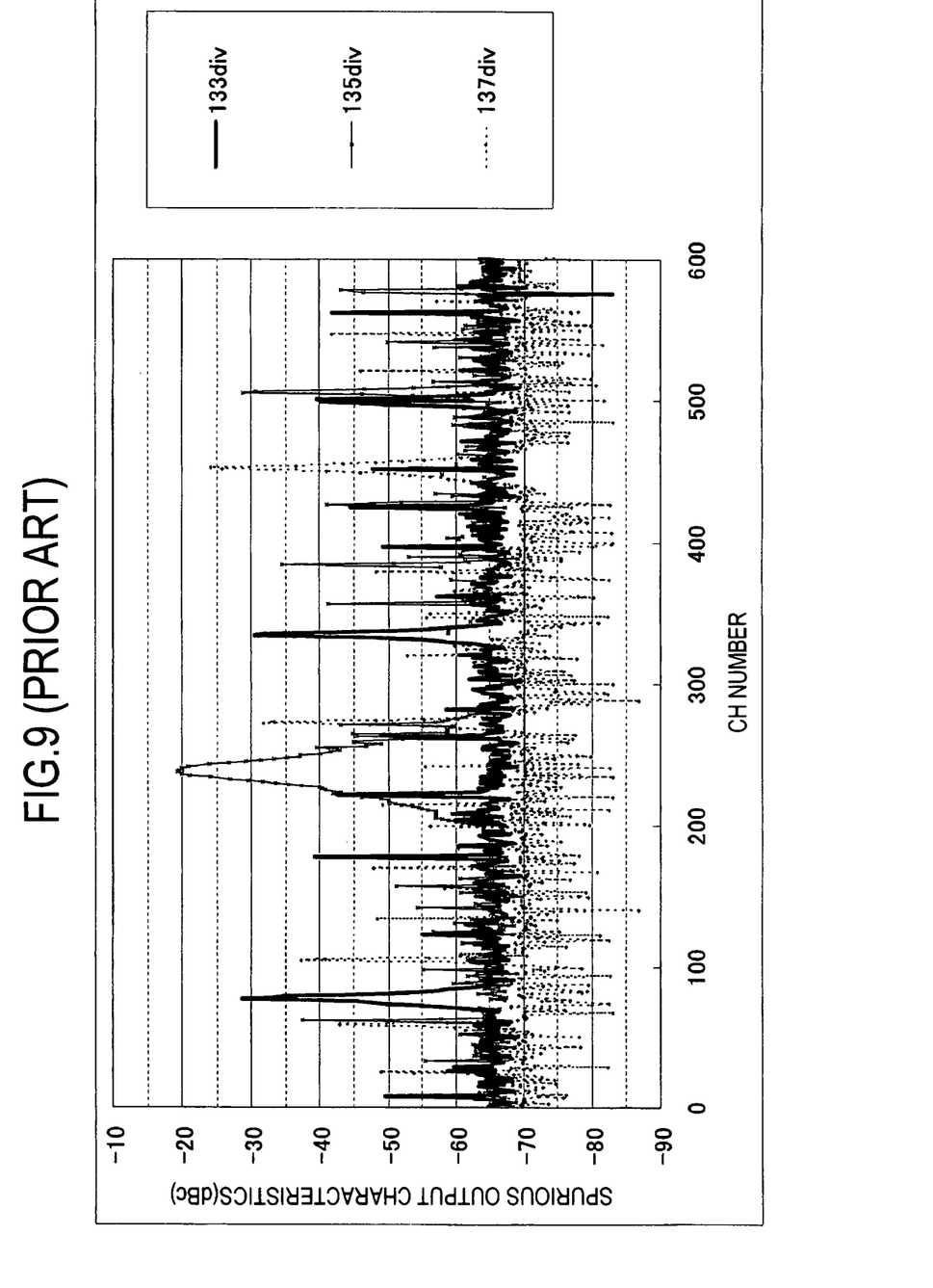
FIG. 9 is a schematic explanatory view of the spurious output characteristics of a VCO 1 of the typical PLL circuit.

[Deterioration Due to Spurious Output: FIG. 9]

When the above PLL circuit is used as a synthesizer, the reference frequency from the DDS circuit 4' or the setting of the frequency division ratio of the PLL IC 2 can be varied to obtain a plurality of channel outputs.

However, as to some of channels, the reference frequency from the DDS circuit 4' or the output of the PLL IC 2 includes a spurious component, and eventually the spurious output of the VCO 1 is generated sometimes.

Moreover, this deterioration due to the spurious output has a dependency on temperature sometimes.

Here, the spurious output characteristics of the VCO 1 will be described with respect to channels 0 to 600 in a case where the frequency division ratio (div) of the PLL IC 2 is varied in the typical PLL circuit with respect to FIG. 9. FIG. 9 is a schematic explanatory view of the spurious output characteristics of the VCO 1 in the typical PLL circuit.

FIG. 9 shows the spurious output characteristics of the VCO 1 in a case where the frequency division ratio of the PLL IC 2 is changed to 133, 135 and 137. It is seen from FIG. 9 that even at any of the frequency division ratios, the channel is present in which the spurious output characteristics remarkably deteriorate. That is, each channel has the frequency division ratio at which the spurious output characteristics are satisfactory and the frequency division ratio at which the spurious output characteristics are not satisfactory, and the characteristics differ with the channels.

[Concerned Technologies]

Examples of a technology concerning the PLL circuit include Japanese Patent Application Laid-Open No. 2004-166179 titled "Semiconductor Integrated Circuit Device for Radio Communication" (applicant: NEC KANSAI LTD., Patent Document 1) and Japanese Patent Application Laid-Open No. 2003-69426 titled "Frequency Synthesizer" (applicant: Matsushita Electric IND. CO. LTD., Patent Document 2).

Moreover, examples of a technology concerning the frequency synthesizer include Japanese Patent Application Laid-Open No. 2007-208367 titled "Synchronizing Signal Generating Apparatus, Transmitter and Control Method" (applicant: KENWOOD CORP., Patent Document 3).

Patent Document 1 discloses a PLL circuit in which a channel number is set through a microcomputer to obtain the optimum frequency division number N or A, thereby alleviating a load on the microcomputer.

However, in Patent Document 1, a reference frequency fr has a fixed value, and it is not described that the frequency is variable.

Patent Document 2 discloses a frequency synthesizer in which even when a reference frequency signal fluctuates in accordance with a temperature change, a frequency division ratio is adjusted in accordance with the temperature change to decrease the fluctuation of an output frequency.

However, it is not described in Patent Document 2 that the reference frequency signal is intentionally fluctuated to suppress the deterioration due to the spurious output.

Patent Document 3 discloses that the frequency division ratio of a PLL circuit, the output frequency/input frequency of a DDS and the like are regulated so that the combination of the input signal frequency and output signal frequency of the DDS sets the spurious output of the DDS to a predetermined level or below.

SUMMARY OF THE INVENTION

In a conventional PLL circuit, a reference frequency from a DDS circuit and the frequency division ratio of a
PLL IC are fixed depending on a channel, and spurious output characteristics are not taken into consideration. Therefore, the spurious output characteristics of a VCO output deteriorate sometimes, and the deterioration depends on temperature, thereby causing a problem that the characteristics fluctuate owing to a temperature change.

The present invention has been developed in view of the above situation, and an object thereof is to provide a PLL circuit in which a VCO output having satisfactory spurious output characteristics can be obtained with respect to all channels to suppress the fluctuation of the characteristics due to a temperature change.

To solve the above problems of conventional examples, according to the present invention, there is provided a PLL circuit comprising: a voltage-controlled oscillator which oscillates a frequency in accordance with a control voltage, the PLL circuit further comprising: a reference frequency generation circuit which outputs a constant frequency corresponding to a channel number; phase comparison means for comparing a frequency divided at a frequency division ratio at which the output frequency of the voltage-controlled oscillator is set with the output frequency of the reference frequency generation circuit to output a phase difference; a loop filter which generates the control voltage based on the phase difference; and a control section which comprises a frequency division ratio table where frequency division ratios to improve spurious output characteristics in the output of the voltage-controlled oscillator for each channel number are stored and which, upon input of the channel number from the outside, reads the frequency division ratio corresponding to the input channel number from the frequency division ratio table to set the frequency division ratio in the phase comparison means and to set the channel number and the frequency division ratio in the reference frequency generation circuit, wherein the reference frequency generation circuit calculates the value of a reference frequency based on the channel number and the frequency division ratio to generate the reference frequency corresponding to the calculated value, which produces effects that even upon the input of any channel number, it is possible to set the optimum frequency division ratio and reference frequency corresponding to the desired output frequency of the voltage-controlled oscillator, whereby the spurious output characteristics of the output of the voltage-controlled oscillator can be improved.

Moreover, according to the present invention, in the above PLL circuit, the phase comparison means is a PLL integrated circuit in which circuits are integrated in one chip, which produces an effect that the whole PLL circuit can be miniaturized.

Furthermore, according to the present invention, in the above PLL circuit, the phase comparison means comprises a frequency divider which divides the output frequency of the voltage-controlled oscillator at the set frequency division ratio; an A/D converter which converts the output of the frequency divider into a digital signal; a phase comparator which compares the output of the A/D converter with the reference frequency; a digital filter which limits the band of the output of the phase comparator; and a D/A converter which converts the output of the digital filter into an analog signal, the control section sets the frequency division ratio in the frequency divider, and the reference frequency generation circuit outputs the generated reference frequency to the phase comparator, which produces an effect that it is possible to realize a digital control PLL circuit where the spurious output characteristics of the output of the voltage-controlled oscillator can be improved without using any PLL integrated circuit.

In addition, according to the present invention, in the above PLL circuit, the control section comprises a temperature sensor which measures an ambient temperature, and the frequency division ratio table where the frequency division ratios to improve the spurious output characteristics in the output of the voltage-controlled oscillator for each channel number are stored in accordance with temperatures, and the control section reads, from the frequency division ratio table, the frequency division ratio corresponding to the input channel number and the temperature detected by the temperature sensor, which produces effects that the optimum frequency division ratio and reference frequency corresponding to the used temperature can be obtained and that the fluctuation of the characteristics due to a temperature change can be suppressed to further improve the spurious output characteristics in the output of the voltage-controlled oscillator.

Moreover, according to the present invention, in the above PLL circuit, the reference frequency generation circuit comprises a table where the channel numbers and the output frequencies of the voltage-controlled oscillator are associated and stored, and upon input of the channel number and the frequency division ratio, the reference frequency generation circuit reads, from the table, the output frequency of the voltage-controlled oscillator corresponding to the input channel number, and divides the output frequency of the voltage-controlled oscillator by the frequency division ratio to calculate the value of the reference frequency based on the output frequency of the voltage-controlled oscillator and the input frequency division ratio, which produces an effect that even when the desired channel number varies, the appropriate value of the reference frequency can easily be calculated.

DESCRIPTION OF REFERENCE NUMERALS

1 ... VCO, 2 ... PLL IC, 3 and 13 ... control circuit, 4 and 14 ... DDS circuit, 5 ... analog filter, 11 ... frequency divider, 12 ... A/D converter, 15 ... phase comparator, 16 ... digital filter, 18 ... D/A converter, 19 ... A/D converter, 31 ... temperature sensor, 32 ... frequency division ratio table, 41 ... control section, 42 ... VCO output frequency table, and 43 ... reference frequency table.

DESCRIPTION OF THE PREFERRED EMBODIMENT

[Outline of Embodiment]

An embodiment of the present invention will be described with reference to drawings.

In a PLL circuit according to the embodiment of the present invention, a control circuit comprises a temperature sensor, and a frequency division ratio table where frequency division ratios to improve experimentally obtained spurious output characteristics for each channel in a used temperature zone are stored. Upon input of a channel number from the outside, the control circuit reads the frequency division ratio corresponding to temperature data detected by the temperature sensor and the channel number to set the ratio in a PLL IC and to set the channel number and the frequency division ratio in a DDS circuit, and the DDS circuit calculates a reference frequency based on the channel number and the frequency division ratio to generate and output a reference frequency signal, whereby in the actually used temperature zone, the spurious output characteristics of the output of a VCO for a desired channel can be improved.

Figure 1:
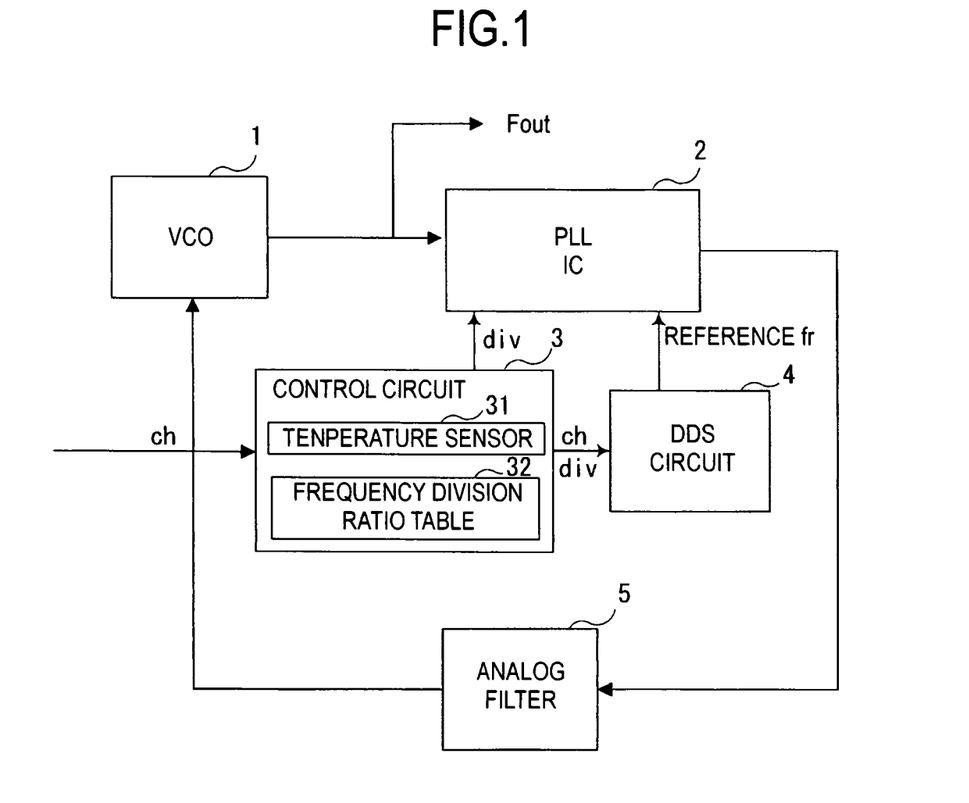
FIG. 1 is a constitution block diagram of a PLL circuit according to the present embodiment.

[PLL Circuit According to the Embodiment: FIG. 1]

A constitution of the PLL circuit according to the present embodiment will be described with reference to FIG. 1. FIG. 1 is a constitution block diagram of the PLL circuit according to the present embodiment.

As shown in FIG. 1, the PLL circuit according to the present embodiment is constituted of a VCO 1, a PLL IC 2, a control circuit 3, a DDS circuit 4 and an analog filter 5, and the constitutions and operations of the VCO 1, the PLL IC 2 and the analog filter 5 are similar to those in a conventional example.

It is to be noted that the PLL IC 2 corresponds to a PLL integrated circuit according to claims, the control circuit 3 corresponds to a control section, and the DDS circuit 4 corresponds to a reference frequency generation circuit.

A characteristic part of the present PLL circuit will be described.

[Control Circuit 3]

The control circuit 3 basically comprises a calculation circuit and a storage section, and the present PLL circuit is characterized in that a frequency division ratio table 32 is stored in the storage section and that a temperature sensor 31 is further provided.

The temperature sensor 31 measures the ambient temperature of a representative component which performs temperature control, for example, the VCO 1 or the like.

The frequency division ratio table 32 is the characteristic part of the present PLL circuit, and stores frequency division ratios to improve spurious output characteristics for each channel number at a used temperature.

Figure 2:
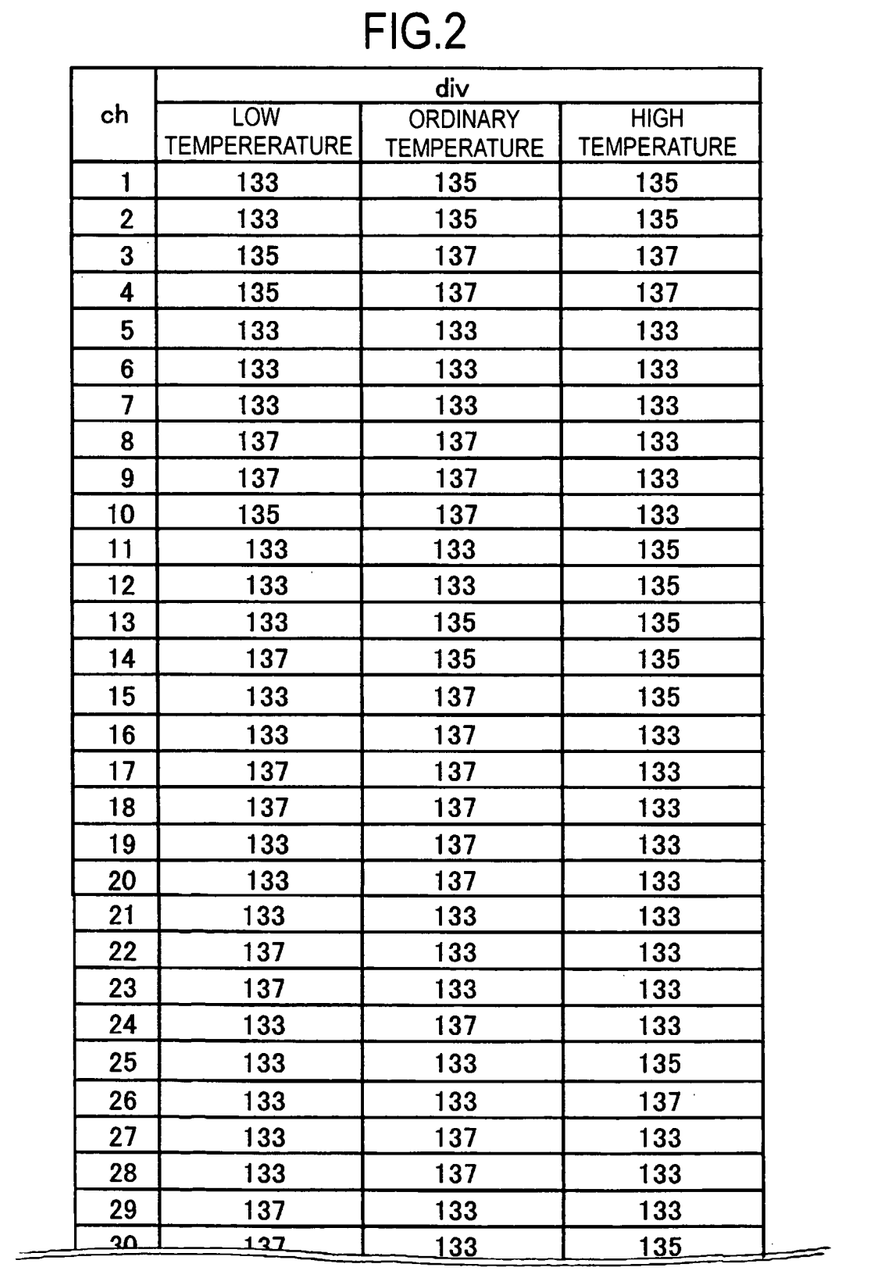
FIG. 2 is a schematic explanatory view of a frequency division ratio table 32.

[Frequency Division Ratio Table: FIG. 2]

Here, the frequency division ratio table 32 stored in the control circuit 3 will be described with reference to FIG. 2. FIG. 2 is a schematic explanatory view of the frequency division ratio table 32.

As shown in FIG. 2, in the frequency division ratio table, the frequency division ratios to improve the spurious output characteristics at each used temperature are stored with respect to all the actually used channels, and in the present PLL circuit, appropriate frequency division ratios at low, ordinary and high temperatures are stored with respect to channels 1 to 600. Here, temperatures less than 0° C. are low temperatures, temperatures of 0° C. to 50° C. are ordinary temperatures, and temperatures of 50° C. or higher are high temperatures.

Table values are experimentally obtained in advance, and the spurious output characteristics of the channels shown in FIG. 9 are compared at each frequency division ratio, thereby selecting the optimum frequency division ratio to improve the spurious output characteristics of each channel.

Moreover, as the characteristic part of the present PLL circuit, the control circuit 3 reads the frequency division ratio from the frequency division ratio table 32 based on the channel number input from the outside and the temperature data obtained from the temperature sensor 31 to set the frequency division ratio in the PLL IC 2 and to set the channel number and the frequency division ratio in the DDS circuit 4. In consequence, every time the channel number is set in the control circuit 3, the optimum frequency division ratio to improve the spurious output characteristics is set in the PLL IC 2 and the DDS circuit 4.

Figure 3:
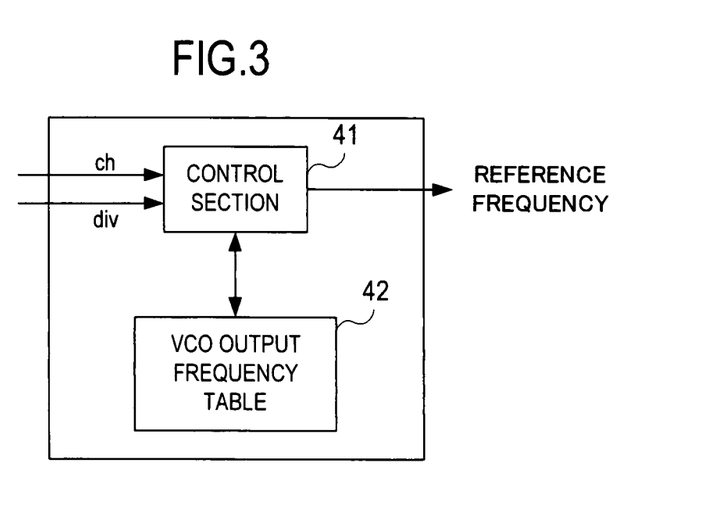
FIG. 3 is a schematic constitution diagram of a DDS circuit 4.

[DDS Circuit 4: FIG. 3]

Next, the DDS circuit 4 of the present PLL circuit will be described with reference to FIG. 3. FIG. 3 is a schematic constitution diagram of the DDS circuit 4.

In a conventional DDS circuit 4', one reference frequency to be generated is determined upon input of a channel number, but in the DDS circuit 4 of the present PLL circuit, the reference frequency is internally calculated based on the channel number and the frequency division ratio input from the control circuit 3, and the reference frequency signal is accordingly generated.

As shown in FIG. 3, the DDS circuit 4 of the present PLL circuit basically comprises a control section 41 and a VCO output frequency table 42, and additionally comprises a sine wave table, a D/A converter and a filter in the same manner as in a conventional circuit.

In the VCO output frequency table 42, the values of the output frequency of the VCO 1 regulated in accordance with the channel numbers are stored. Here, the output frequencies of the VCO 1 are stored with respect to the channels 0 to 600.

Moreover, in the present DDS circuit 4, the control section 41 calculates the value of the reference frequency to be output based on the channel number and frequency division ratio input from the control circuit 3 shown in FIG. 1, and generates the reference frequency signal based on the value to output the signal to the PLL IC 2.

Figure 4:
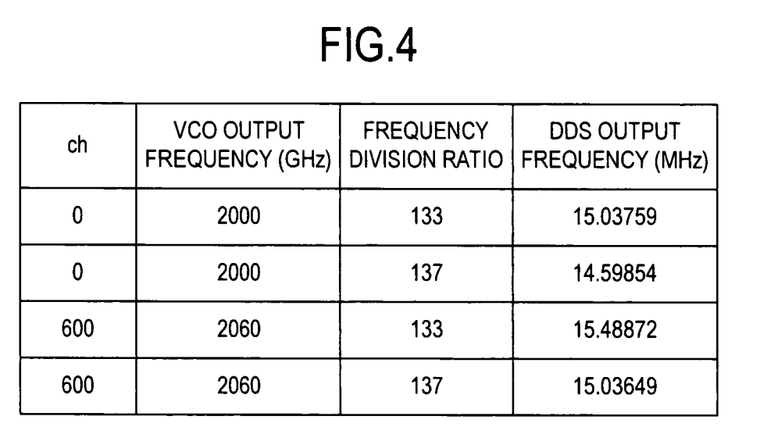
FIG. 4 is a table diagram showing the example of a reference frequency output from the DDS circuit 4.

[Calculation of Reference Frequency: FIG. 4]

Upon input of the channel number and the frequency division ratio from the control circuit 3, the control section 41 of the DDS circuit 4 reads the VCO output frequency corresponding to the input channel number with reference to the VCO output frequency table 42.

Moreover, the control section 41 calculates the reference frequency based on an equation of the reference frequency (MHz)=the VCO output frequency (GHz)/the frequency division ratio.

A specific calculation example is shown in FIG. 4. FIG. 4 is a table diagram showing examples of the reference frequency output from the DDS circuit 4.

As shown in FIG. 4, when the channel number is, for example, 0 and the frequency division ratio is, for example, 133, the reference frequency (described as "DDS output frequency" in the diagram) is 15.03759 MHz. Even with the same channel number 0, the reference frequency is 14.59854 MHz, when the frequency division ratio is 137. In the present PLL circuit, even with the same channel number, the optimum frequency division ratio differs with the temperature as regulated in the frequency division ratio table of FIG. 2, and hence the reference frequency output from the DDS circuit 4 differs.

Furthermore, in the control section 41 of the DDS circuit 4, sine wave data is output based on the calculated value of the reference frequency, the data is converted into an analog signal in the D/A converter, and the analog sine wave signal is output as the reference frequency signal to the PLL IC 2 through the filter.

In consequence, the DDS circuit 4 can generate the reference frequency signal based on the frequency division ratio to improve the spurious output characteristics in accordance with the channel number and the used temperature.

Figure 5:
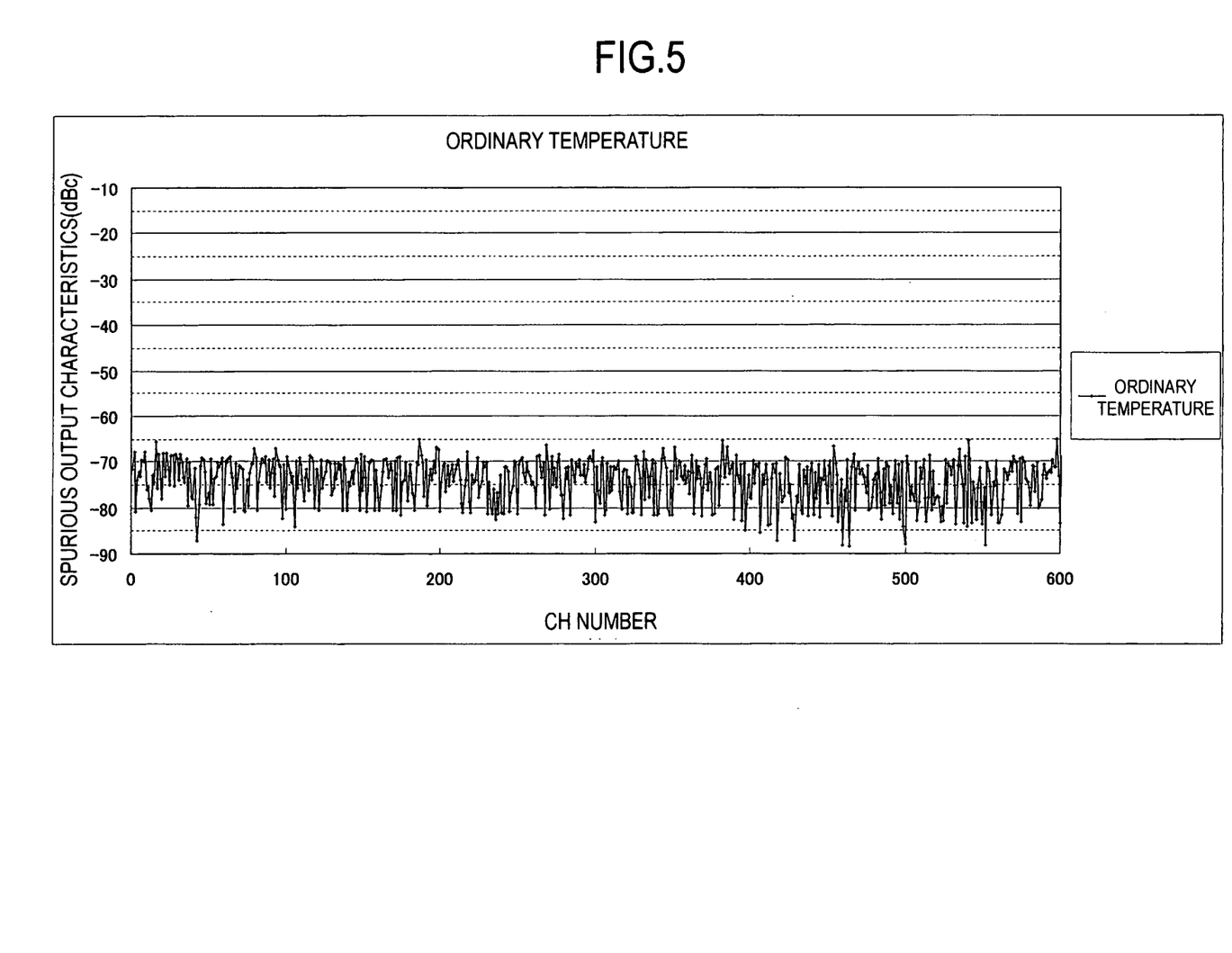
FIG. 5 is a schematic explanatory view of spurious output characteristics at ordinary temperature in a VCO 1 of the present PLL circuit.

[Spurious Output Characteristics of the present PLL Circuit: FIG. 5]

Next, the spurious output characteristics of the VCO 1 with respect to the channels 0 to 600 in the present PLL circuit will be described with reference to FIG. 5. FIG. 5 is a schematic explanatory view of the spurious output characteristics at ordinary temperature in the VCO 1 of the present PLL circuit.

As shown in FIG. 5, it is recognized that in the present PLL circuit, the optimum frequency division ratio for each channel number is set in the PLL IC 2, and the reference frequency of the DDS circuit 4 is accordingly varied, whereby satisfactory characteristics are obtained with respect to all the channel numbers as compared with the spurious output characteristics of the typical PLL circuit of FIG. 9.

It is to be noted that FIG. 5 only shows the characteristics at ordinary temperature, but at the low and high temperatures, the satisfactory spurious output characteristics are obtained as compared with the conventional example.

Figure 6:
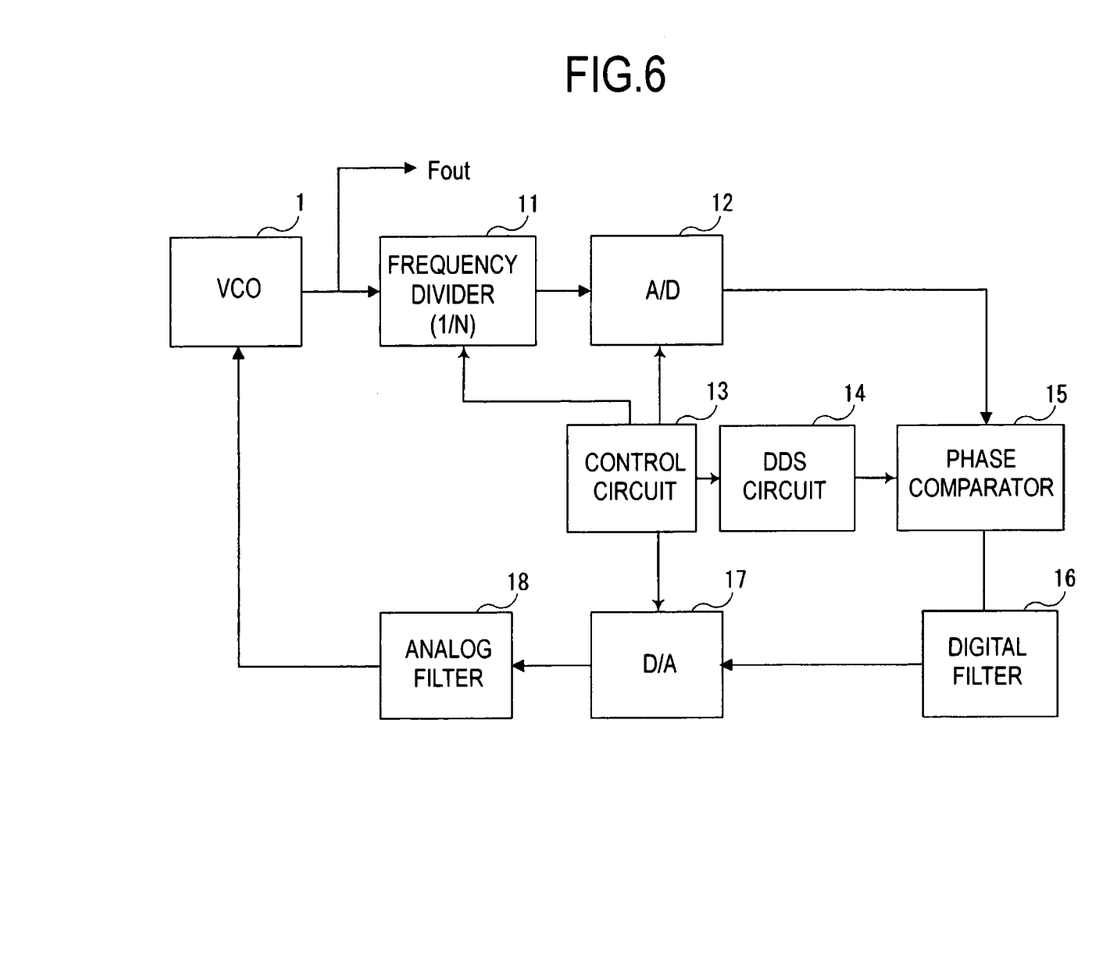
FIG. 6 is a constitution block diagram of a digital control PLL circuit to which the present PLL circuit is applied.

[Application Example of the present PLL Circuit: FIG. 6]

Next, the application example of the present PLL circuit will be described with reference to FIG. 6. FIG. 6 is a constitution block diagram of a digital control PLL circuit to which the present PLL circuit is applied.

As shown in FIG. 6, the digital control PLL circuit to which the present circuit is applied comprises a frequency divider 11, an A/D converter 12, a phase comparator 15, a digital filter 16 and a D/A converter 17 instead of the PLL IC 2 of FIG. 1, and a VCO 1, a DDS circuit 14 and an analog filter 18 are the same as those of the PLL circuit of FIG. 1.

A control circuit 13 comprises a temperature sensor and a frequency division ratio table in the same manner as in the control circuit 3 of the PLL circuit of FIG. 1, and is different from the PLL circuit of FIG. 1 in that an output timing is instructed to the A/D converter 12 and the D/A converter 17.

Moreover, the control circuit 13 of the digital control PLL circuit reads the optimum frequency division ratio from the frequency division ratio table based on an input channel number and detected temperature data to set the ratio in the frequency divider 11 in the same manner as in the control circuit 3 of the PLL circuit of FIG. 1.

Furthermore, the control circuit 13 outputs the channel number and the frequency division ratio to the DDS circuit 14, and the DDS circuit 14 calculates a reference frequency based on the input channel number and frequency division ratio to output sine wave data to the phase comparator 15.

The operation of the digital control PLL circuit having the above constitution will briefly be described.

The frequency of the output signal of the VCO 1 is divided by the frequency divider 11 at the frequency division ratio (N) designated by the control circuit 13, and the signal is A/D converted at a designated timing in the A/D converter 12, and input into the phase comparator 15.

The phase comparator 15 compares the reference frequency from the DDS circuit 14 with the phase of output data from the A/D converter 12 to detect a phase difference, and a phase difference signal is filtered through the digital filter 16, and converted into an analog signal at a designated timing in the D/A converter 17. The band of the signal is limited by the analog filter 18, and the control voltage is applied to the VCO 1.

In the digital control PLL circuit to which the present PLL circuit is applied, the optimum frequency division ratio is set in accordance with the temperature and channel in the frequency divider 11 and the DDS circuit 14, which produces an effect that the spurious output characteristics of the output of the VCO 1 are improved.

[Effect of the Embodiment]

According to the PLL circuit of the embodiment of the present invention, the control circuit 3 comprises the temperature sensor 31, and the frequency division ratio table 32 where the frequency division ratios to optimize the spurious output characteristic of each channel at the temperatures are stored. The control circuit 3 reads the corresponding frequency division ratio from the frequency division ratio table 32 based on the channel number input from the outside and the temperature data detected by the temperature sensor 31 to set the frequency division ratio in the PLL IC 2 and to set the frequency division ratio and the channel number in the DDS circuit 4. The DDS circuit 4 calculates the value of the reference frequency based on the set frequency division ratio and channel number to generate the reference frequency signal in the PLL circuit. This produces an effect that even with respect to any temperature or channel, the deterioration of the spurious output characteristics in the PLL IC 2 and the DDS circuit 4 can be prevented to improve the spurious output characteristics of the VCO output.

It is to be noted that in the present embodiment, the frequency division ratio table at the temperatures is provided in the control circuit 3. However, when the temperature zone is limited (to, for example, ordinary temperature or the like) by an environment where the present PLL circuit is used, the only frequency division ratios corresponding to the temperature zone may be stored.

Moreover, when the characteristics noticeably fluctuate owing to the temperature, the segments of the temperature zone may be increased.

The present invention is suitable for a PLL circuit which can improve spurious output characteristics.

What is claimed is:

1. A PLL circuit comprising a voltage-controlled oscillator which oscillates a frequency in accordance with a control voltage, the PLL circuit further comprising:

a reference frequency generation circuit which outputs a constant frequency corresponding to a channel number;

phase comparison means for comparing a frequency divided at a frequency division ratio at which the output frequency of the voltage-controlled oscillator is set with the output frequency of the reference frequency generation circuit to output a phase difference;

a loop filter which generates the control voltage based on the phase difference; and a control section which comprises a frequency division ratio table where frequency division ratios to improve spurious output characteristics in the output of the voltage-controlled oscillator for each channel number are stored and which, upon input of the channel number from the outside, reads the frequency division ratio corresponding to the input channel number from the frequency division ratio table to set the frequency division ratio in the phase comparison means and to set the channel number and the frequency division ratio in the reference frequency generation circuit, wherein the reference frequency generation circuit calculates the value of a reference frequency based on the channel number and the frequency division ratio to generate the reference frequency corresponding to the calculated value.

2. The PLL circuit according to claim 1, wherein the phase comparison means is a PLL integrated circuit in which circuits are integrated in one chip.

3. The PLL circuit according to claim 2, wherein the control section comprises a temperature sensor which measures an ambient temperature, and the frequency division ratio table where the frequency division ratios to improve the spurious output characteristics in the output of the voltage-controlled oscillator for each channel number are stored in accordance with temperatures, and the control section reads, from the frequency division ratio table, the frequency division ratio corresponding to the input channel number and the temperature detected by the temperature sensor.

4. The PLL circuit according to claim 2, wherein the reference frequency generation circuit comprises a table where the channel numbers and the output frequencies of the voltage-controlled oscillator are associated and stored, and upon input of the channel number and the frequency division ratio, the reference frequency generation circuit reads, from the table, the output frequency of the voltage-controlled oscillator corresponding to the input channel number, and divides the output frequency of the voltage-controlled oscillator by the frequency division ratio to calculate the value of the reference frequency based on the output frequency of the voltage-controlled oscillator and the input frequency division ratio.

5. The PLL circuit according to claim 1, wherein the phase comparison means comprises a frequency divider which divides the output frequency of the voltage-controlled oscillator at the set frequency division ratio; an A/D converter which converts the output of the frequency divider into a digital signal; a phase comparator which compares the output of the A/D converter with the reference frequency; a digital filter which limits the band of the output of the phase comparator; and a D/A converter which converts the output of the digital filter into an analog signal, the control section sets the frequency division ratio in the frequency divider, and the reference frequency generation circuit outputs the generated reference frequency to the phase comparator.

6. The PLL circuit according to claim 5, wherein the control section comprises a temperature sensor which measures an ambient temperature, and the frequency division ratio table where the frequency division ratios to improve the spurious output characteristics in the output of the voltage-controlled oscillator for each channel number are stored in accordance with temperatures, and the control section reads, from the frequency division ratio table, the frequency division ratio corresponding to the input channel number and the temperature detected by the temperature sensor.

7. The PLL circuit according to claim 5, wherein the reference frequency generation circuit comprises a table where the channel numbers and the output frequencies of the voltage-controlled oscillator are associated and stored, and upon input of the channel number and the frequency division ratio, the reference frequency generation circuit reads, from the table, the output frequency of the voltage-controlled oscillator corresponding to the input channel number, and divides the output frequency of the voltage-controlled oscillator by the frequency division ratio to calculate the value of the reference frequency based on the output frequency of the voltage-controlled oscillator and the input frequency division ratio.

* * * * *